(12) United States Patent
Park et al.

(10) Patent No.: US 8,266,512 B2
(45) Date of Patent: Sep. 11, 2012

(54) METHOD AND APPARATUS FOR SIGNAL TRANSMISSION/RECEPTION IN A COMMUNICATION SYSTEM USING AN HARQ SCHEME

(75) Inventors: Sung-Eun Park, Seoul (KR);
Seung-Hoon Choi, Seoul (KR);
Song-Nam Hong, Suwon-si (KR);
Ho-Kyu Choi, Seongnam-si (KR);
Jae-Weon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 884 days.

(21) Appl. No.: 12/367,040

(22) Filed: Feb. 6, 2009

(65) Prior Publication Data

US 2009/0204868 A1    Aug. 13, 2009

(30) Foreign Application Priority Data

Feb. 12, 2008   (KR) .................. 10-2008-0012786

(51) Int. Cl.
*G06F 11/00* (2006.01)
*H03M 13/00* (2006.01)
(52) U.S. Cl. .................. 714/801; 714/752; 714/758
(58) Field of Classification Search .................. 714/752, 714/758, 801
See application file for complete search history.

(56) References Cited

U.S. PATENT DOCUMENTS 7,913,145 B2 * 3/2011 Matsumoto ................ 714/751
7,934,140 B2 * 4/2011 Oh et al. ...................... 714/752

* cited by examiner

*Primary Examiner* — Sam Rizk
(74) *Attorney, Agent, or Firm* — Jefferson IP Law, LLP

(57) ABSTRACT

An apparatus and method for transmitting a signal in a communication system using a Hybrid Automatic Repeat reQuest (HARQ) scheme are provided. The method includes generating a codeword vector by encoding an information vector by using a first parity check matrix of Low Density Parity Check (LDPC) codes, generating a transmission vector by processing the codeword vector, and transmitting the transmission vector. When the first parity check matrix includes a plurality of square matrix columns, each square matrix includes a size of L×L, the first parity check matrix is one of p parity check matrixes stored in the signal transmission apparatus, the p parity check matrixes support different numbers of information vector square matrix columns, and each of the numbers of information vector square matrix columns indicates the number of square matrix columns corresponding to the information vector from among the plurality of square matrix columns. The first parity check matrix is a parity check matrix supporting the number of information vector square matrix columns determined by using the length of the information vector and the value L from the p parity check matrixes, and the value L is determined by using p and the length of the information vector.

24 Claims, 3 Drawing Sheets

| $P_{1,1}$ | $P_{1,2}$ | $P_{1,3}$ | $P_{1,4}$ | $\cdots$ | $P_{1,n}$ |
|---|---|---|---|---|---|
| $P_{2,1}$ | $P_{2,2}$ | $P_{2,3}$ | $P_{2,4}$ | $\cdots$ | $P_{2,n}$ |
| $\vdots$ | $\vdots$ | $\vdots$ | $\vdots$ | | $\vdots$ |
| $P_{m,1}$ | $P_{m,2}$ | $P_{m,3}$ | $P_{m,4}$ | $\cdots$ | $P_{m,n}$ |

METHOD AND APPARATUS FOR SIGNAL TRANSMISSION/RECEPTION IN A COMMUNICATION SYSTEM USING AN HARQ SCHEME

PRIORITY

This application claims the benefit under 35 U.S.C. §119(a) of a Korean patent application filed in the Korean Industrial Property Office on Feb. 12, 2008 and assigned Serial No. 10-2008-0012786, the entire disclosure of which is hereby incorporated by reference.

BACKGROUND OF THE INVENTION

1. Field of the Invention

The present invention relates to a method and an apparatus for signal transmission/reception in a communication system using a Hybrid Automatic Repeat reQuest (HARQ) scheme.

2. Description of the Related Art

Next generation communication systems are developing towards systems capable of providing a high speed large-capacity service to Mobile Stations (MSs). Representative examples of the next generation communication systems include an Institute of Electrical and Electronics Engineers (IEEE) 802.16 communication system, a Mobile Worldwide Interoperability for Microwave Access (WiMAX) communication system, and an IEEE 802.11 communication system. The Mobile WiMAX communication system is a communication system based on the IEEE 802.16 communication system, and the IEEE 802.16 communication system is a communication system using an IEEE 802.16 standard.

In the next generation communication systems, use of Low Density Parity Check (LDPC) codes is taken into consideration to support high speed large-capacity data transmission/reception, because it is possible to achieve parallel implementation of the LDPC codes, which makes it possible to implement a decoder having a throughput higher than other channels codes, such as turbo codes or convolutional codes.

Hereinafter, a conventional parity check matrix for structured LDPC codes will be described with reference to FIG. 1.

FIG. 1 illustrates a conventional parity check matrix for structured LDPC codes.

Referring to FIG. 1, structured LDPC codes may be generated using a parity check matrix having a size of mL×nL. That is, each row of the parity check matrix for structured LDPC codes includes m square matrixes each having a size of $L \times L$, and each column of the parity check matrix for structured LDPC codes includes n square matrixes each having a size of $L \times L$, wherein the square matrix may be a zero matrix or a permutation matrix. As used herein, each row or each column of the permutation matrix includes a weight of one (1), wherein the weight corresponds to the number of elements having a value (e.g. 1) other than zero (0). In FIG. 1, $P_{m,n}$ refers to a square matrix located at a position at which the $m^{th}$ square matrix row and the $n^{th}$ square matrix column intersect when the parity check matrix includes m square matrix rows and n square matrix columns.

According to the parity check matrix for structured LDPC codes as described above with reference to FIG. 1, it is possible to generate LDPC codes having various lengths by using only one parity check matrix, through a change of the size (i.e. the vale $L$) of each square matrix in the parity check matrix. Hereinafter, the scheme of changing the size of the square matrix to generate LDPC codes having different lengths will be referred to as a "lifting scheme".

Meanwhile, in the next generation communication systems, various schemes including a Hybrid Automatic Repeat reQuest (HARQ) scheme and an Adaptive Modulation and Coding (AMC) scheme have been proposed to support high speed large capacity data transmission/reception. To use the HARQ scheme and the AMC scheme, it may be necessary to support various code rates.

However, the structured LDPC codes are disadvantageous in view of the code rates. That is, since the structured LDPC codes are generated by using a parity check matrix having a fixed size, it is relatively difficult to change the length of the structured LDPC codes, in comparison with other channel codes. Therefore, the structured LDPC codes are not flexible in view of the coding rate.

SUMMARY OF THE INVENTION

An aspect of the present invention is to address the above-mentioned problems and/or disadvantages and to provide at least the advantages described below. Accordingly, an aspect of the present invention is to provide an apparatus and a method for signal transmission/reception, which can support various coding rates in a communication system using an HARQ scheme.

In accordance with an aspect of the present invention, a method of transmitting a signal by a signal transmission apparatus in a communication system using an HARQ scheme is provided. The method includes generating a codeword vector by encoding an information vector by using a first parity check matrix of LDPC codes, generating a transmission vector by processing the codeword vector, and transmitting the transmission vector, wherein, when the first parity check matrix includes a plurality of square matrix columns, each square matrix includes a size of L×L, the first parity check matrix is one of p parity check matrixes stored in the signal transmission apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

In accordance with another aspect of the present invention, an apparatus for transmitting a signal in a communication system using an HARQ scheme is provided. The apparatus includes an encoder for generating a codeword vector by encoding an information vector by using a first parity check matrix of LDPC codes, a transmitter for generating a transmission vector by processing the codeword vector, and for transmitting the transmission vector, wherein, when the first parity check matrix includes a plurality of square matrix columns, each square matrix includes a size of L×L, the first parity check matrix is one of p parity check matrixes stored in the signal transmission apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

In accordance with yet another aspect of the present invention, a method of receiving a signal by a signal reception apparatus in a communication system using an HARQ scheme is provided. The method includes generating a reception vector by processing a received signal, and restoring an information vector by decoding the reception vector by using a first parity check matrix of LDPC codes, wherein, when the first parity check matrix includes a plurality of square matrix columns, each square matrix includes a size of L×L, the first parity check matrix is one of p parity check matrixes stored in a signal transmission apparatus corresponding to the signal reception apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

In accordance with still another aspect of the present invention, an apparatus for receiving a signal in a communication system using an HARQ scheme is provided. The apparatus includes a receiver for generating a reception vector by processing a received signal, and a decoder for restoring an information vector by decoding the reception vector by using a first parity check matrix of LDPC codes, wherein, when the first parity check matrix includes a plurality of square matrix columns, each square matrix includes a size of L×L, the first parity check matrix is one of p parity check matrixes stored in a signal transmission apparatus corresponding to the signal reception apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which:

FIG. 1 illustrates a conventional parity check matrix for structured LDPC codes;

Throughout the drawings, like reference numerals will be understood to refer to like parts, components, and structures.

DETAILED DESCRIPTION OF EXEMPLARY EMBODIMENTS

The following description with reference to the accompanying drawings is provided to assist in a comprehensive understanding of exemplary embodiments of the present invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. Also, descriptions of well-known functions and constructions are omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention are provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces First, a method of supporting an Incremental Redundancy (IR) type HARQ scheme by using a single parity check matrix will be described with reference to FIG. 2.

Figure 2:
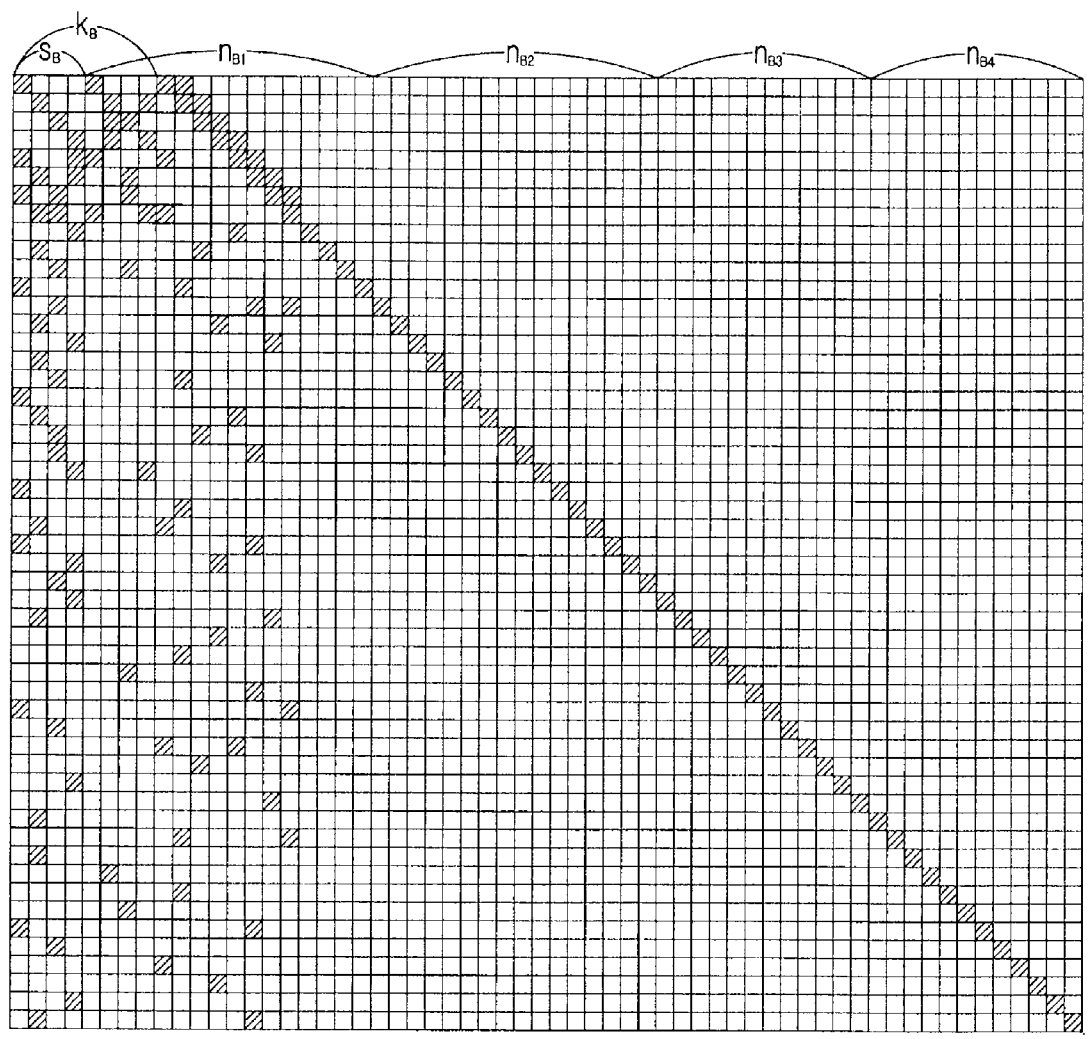
FIG. 2 illustrates a parity check matrix of multi-edge type structured LDPC codes according to an exemplary embodiment of the present invention.

FIG. 2 illustrates a parity check matrix of multi-edge type structured LDPC codes according to an exemplary embodiment of the present invention.

Referring to FIG. 2, the parity check matrix includes a plurality of square matrix each having a size of $L \times L$, wherein the square matrix may be a zero matrix or a permutation matrix. In FIG. 2, the shaded portions correspond to the case where the square matrix is a permutation matrix, and the unshaded portions correspond to the case where the square matrix is a zero matrix. Further, the parity check matrix includes a $(s_B+n_{B1}+n_{B2}+n_{B3}+n_{B4})$ number of square matrix columns. In FIG. 2, $k_B$ denotes the number of square matrix columns corresponding to an information vector, and $s_B$ denotes the number of square matrix columns that can be punctured from among the $k_B$ square matrix columns and includes an integer value that are not a negative value. The $s_B$ is determined to be identical to the number of bits to be punctured in the multi-edge type structured LDPC codes generated using the parity check matrix. Since $s_B$ corresponds to the number of the square matrix columns as described above, the number of bits to be punctured is $s_b \times L$. Since $s_B$ has no direct relation to an exemplary embodiment of the present invention, a more detailed description thereof will be omitted here.

Further, in the single parity check matrix used to support the IR type HARQ scheme, $n_{B1}$ denotes the number of square matrix columns corresponding to the codeword vector transmitted at the time of the first HARQ transmission, $n_{B2}$ denotes the number of square matrix columns corresponding to the codeword vector transmitted at the time of the second HARQ transmission, $n_{B3}$ denotes the number of square matrix columns corresponding to the codeword vector transmitted at the time of the third HARQ transmission, and $n_{B4}$ denotes the number of square matrix columns corresponding to the codeword vector transmitted at the time of the fourth HARQ transmission. As used herein, the first HARQ transmission corresponds to the initial transmission. Further, it is understood that the number of square matrix columns corresponding to the codeword vector transmitted at each time of the HARQ transmission can be differently determined according to the modulation order used in a signal transmission apparatus. The example shown in FIG. 2 corresponds to the case where $k_B=8$, $s_B=4$, $n_{B1}=16$, $n_{B2}=16$, $n_{B3}=12$, and $n_{B4}=12$.

Figure 3:
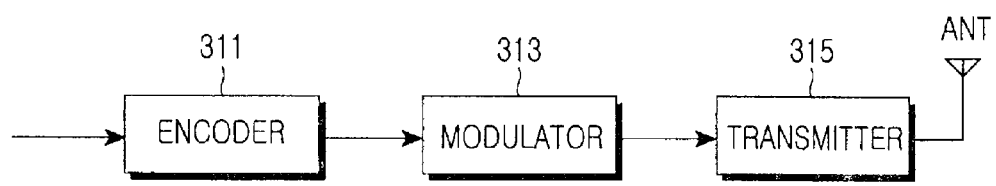
FIG. 3 is a block diagram illustrating a structure of a signal transmission apparatus of a communication system using an HARQ scheme according to an exemplary embodiment of the present invention.

FIG. 3 is a block diagram illustrating a structure of a signal transmission apparatus of a communication system using an HARQ scheme according to an exemplary embodiment of the present invention.

Referring to FIG. 3, the signal transmission apparatus includes an encoder 311, a modulator 313, and a transmitter 315. First, when an information vector to be transmitted occurs in the signal transmission apparatus, the information vector is transferred to the encoder 311. It is assumed that the length of the information vector is $k_B \times L$ as described above with reference to FIG. 2. The encoder 311 generates a codeword vector by encoding the information vector according to a preset encoding scheme, and outputs the generated codeword vector to the modulator 313. In FIG. 2, the encoder 311 outputs the generated codeword vector as it is to the modulator 313 when $s_B$ is zero (0), while the encoder 311 outputs the generated codeword vector to the modulator 313 after puncturing $s_B \times L$ bits in the generated codeword vector when $s_B$ is not zero (0). The parity check matrix shown in FIG. 2 is based on an assumption that $s_B$ is zero (0). Therefore, the encoder 311 outputs the generated codeword vector without puncturing to the modulator 313.

The modulator 313 generates a modulation vector by modulating the codeword vector according to a predefined modulation scheme, and outputs the modulation vector to the transmitter 315. The transmitter 315 receives the modulation vector from the modulator 313, processes the modulation vector for transmission, and transmits the modulation vector through an antenna.

Hereinafter, an operation of the encoder 311 will be described in detail. First, the encoder 311 stores a total of p parity check matrixes and determines a lifting element L corresponding to a predefined (n, k) codeword vector and the number $k_B$ of square matrix columns corresponding to the information vector. The lifting element is determined to be substantially identical to the size of the square matrix, and includes a value of L when the size of the square matrix is L×L. Further, k denotes the length of the information vector, and n denotes the length of the (n, k) codeword vector. The encoder 311 selects a parity check matrix capable of generating the (n, k) codeword vector from among the p parity check matrixes. It is assumed that the parity check matrixes have different $k_B$ values and the p number of $k_B$ values are p, p+1, p+2, ..., 2P−1. Further, the encoder 311 encodes the information vector by using the selected parity check matrix, thereby generating a codeword vector. The following description is based on an assumption that p includes a value in the range of 7 to 12, although it may have a value other than the value of 7 to 12.

Hereinafter, an operation of selecting a parity check matrix by the encoder 311 will be described with reference to FIG. 4.

Figure 4:
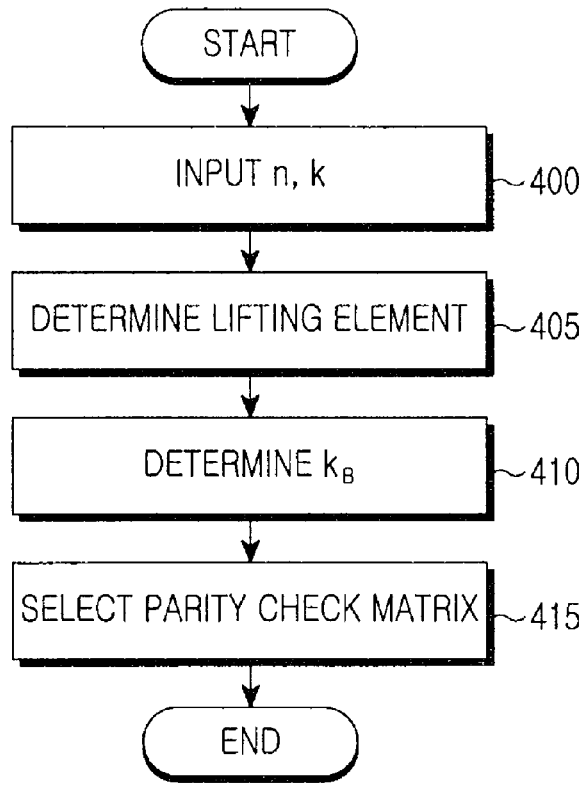
FIG. 4 is a flow diagram illustrating a process in which the encoder of FIG. 3 selects a parity check matrix according to an exemplary embodiment of the present invention.

FIG. 4 is a flow diagram illustrating a process in which the encoder of FIG. 3 selects a parity check matrix according to an exemplary embodiment of the present invention.

Referring to FIG. 4, in step 400, the encoder 311 receives an input of a value k, which denotes the length of an information vector to be used for generation of a codeword vector, and a value n, which denotes the length of the codeword vector to be generated. Then, in step 405, the encoder 311 determines the lifting element L to be used for generation of an (n, k) codeword vector by using Equation (1) below, and proceeds to step 410.

$$l = \log_2 \qquad (1)$$
$$L = \left\lceil \log_2 \frac{k}{2p-1} \right\rceil$$

In Equation (1), $\lceil x \rceil$ refers to a minimum integer larger than or equal to x.

Then, the encoder 311 determines the value $k_B$ by using Equation (2) below, and then proceeds to step 415.

$$k_B = \lceil 2^{-l} k \rceil = \left\lceil \frac{k}{L} \right\rceil \qquad (2)$$

In step 415, the encoder 311 selects a parity check matrix having the determined $k_B$ from a total of p parity check matrixes, as the parity check matrix to be used for generation of the (n, k) codeword vector. In this step, the encoder 311 determines the value of $n_B$ by using Equation (3) below.

$$n_B = \lceil 2^{-l}(n-(k-2^l k_B)) \rceil \qquad (3)$$

Hereinafter, described will be an operation of parity check matrix selection for generation of an (n, k) codeword vector when p=8, that is, when the channel encoder 31 stores a total of eight parity check matrixes. At this time, since the eight parity check matrixes stored in the encoder 311 have different $k_B$ values, the eight parity check matrixes can be discriminated from each other by the $k_B$ values. Here, it is assumed that the $k_B$ values are 8, 9, 10, 11, 12, 13, 14, and 15.

First, the encoder 311 calculates the lifting element L by using Equation (1), as defined by Equation (4) below.

$$l = \log_2 \qquad (4)$$
$$L = \left\lceil \log_2 \frac{k}{15} \right\rceil$$

Further, the encoder 311 determines the $k_B$ value by using Equation (2), and selects a parity check matrix corresponding to the determined $k_B$ value.

By way of example, the operation of the encoder 311 will be described in detail below based on a parity check matrix of a codeword vector having a coding rate of ½ wherein n=2000 and k=1000.

First, l is calculated as by $$l = \log_2$$
$$L = \left\lceil \log_2 \frac{1000}{15} \right\rceil = \lceil \log_2 66.67 \rceil = 7$$

Equation (4), and the lifting element L is then determined as $L=2^7=128$. Next, the $k_B$ value is determined as $$k_B = \lceil 2^{-l} k \rceil = \left\lceil \frac{k}{L} \right\rceil = \left\lceil \frac{1000}{128} \right\rceil = \lceil 7.8125 \rceil = 8$$

by Equation (2).

Therefore, the encoder 311 selects the parity check matrix having the $k_B$ value of 8 from the eight parity check matrixes having the $k_B$ values of 8, 9, 10, 11, 12, 13, 14, and 15, respectively.

For example, when the information vector delivered to the encoder 311 includes 1000 information bits (k=1000), the parity check matrix selected according to the (k=1000) requires $k_B \times L = 8 \times 128 = 1024$ input information bits. Therefore, the 24 bits exceeding the 1000 information bits may be padded with particular bits (e.g. zero bits) known in advance between a signal transmission apparatus and a signal reception apparatus.

Further, the $n_B$ value is determined by using Equation (3) as $$n_B = \lceil 2^{-l}(n-(k-2^l k_B)) \rceil = \left\lceil \frac{(2000-(1000-128*8))}{128} \right\rceil = 16.$$

As p, which denotes the number of the parity check matrixes, increases, a space for storing the parity check matrix by the encoder 311 also increases. However, the number of bits to be padded to generate the same (n, k) codeword vector by the encoder 311 decreases. By using Equation (5) below, the encoder 311 calculates the number b of bits to be padded.

$$b = k_B L - k \quad (5)$$

According to the calculation of the number of bits to be padded for each of the p $k_B$ values (i.e. 8, 9, 10, 11, 12, 13, 14, and 15) by using Equation (5), b bits corresponding to about 14.3% of the k value are padded when p=7, that is, when seven parity check matrixes are used.

Meanwhile, as p increases, the number of padded bits decreases. When p is 12, that is, when 12 parity check matrixes are used, the number b of the padded bits corresponds to only about 8.4% of the k value, so that the hardware efficiency increases. Therefore, p, which corresponds to the number of parity check matrixes to be used for generation of the (n, k) codeword vector, may be selected through a trade-off between the storing capacity of the encoder 311 and the number of the padded bits.

Hereinafter, an operation of selecting a parity check matrix when p changes from 7 to 12 will be described.

First, the case when p is seven (7) is discussed.

Since p is seven (7), which implies that the encoder uses a total of seven parity check matrixes, the encoder may select a parity check matrix to be used for generation of an (n, k) codeword vector from the seven parity check matrixes. Herein, the seven parity check matrixes are discriminated from each other by the $k_B$ values, wherein the p (seven) $k_B$ values include 7, 8, 9, 10, 11, 12, and 13. Further, the lifting element L is determined by Equation (6) below.

$$l = \log_2 \quad (6)$$
$$L = \left\lceil \log_2 \frac{k}{13} \right\rceil$$

Further, the $k_B$ value is determined to be one value from among 7, 8, 9, 10, 11, 12, and 13 by using Equation (2). Based on the determined $k_B$ value, a parity check matrix to be used for generation of an (n, k) codeword vector is selected.

Hereinafter, an operation of selecting a parity check matrix for generation of a (2000, 1000) codeword vector having a coding rate of ½ wherein n=2000 and k=1000 will be described as an example.

First, l is calculated as $l=\log_2$ $$L = \left\lceil \log_2 \frac{1000}{13} \right\rceil = \lceil \log_2 76.9 \rceil = \lceil 6.26 \rceil = 7$$

by Equation (4), and the lifting element L is then determined as $L \times 2^7 = 128$. Further, the $k_B$ value is determined as $$k_B = \lceil 2^{-l} k \rceil = \left\lceil \frac{k}{L} \right\rceil = \left\lceil \frac{1000}{128} \right\rceil = \lceil 7.8125 \rceil = 8$$

by Equation (2). Therefore, as the parity check matrix for generation of the (2000, 1000) codeword vector, the parity check matrix having the $k_B$ value of 8 is selected from the seven parity check matrixes having the $k_B$ values of 7, 8, 9, 10, 11, 12, and 13, respectively. Further, the $n_B$ value is determined by using Equation (3) as $$n_B = \lceil 2^{-l}(n-(k-2^l k_B)) \rceil = \left\lceil \frac{(2000-(1000-128*8))}{128} \right\rceil = 16.$$

Second, the case when p is eight (8) is discussed.

Since p is eight (8), which implies that the encoder uses a total of eight parity check matrixes, the encoder may select a parity check matrix to be used for generation of an (n, k) codeword vector from the eight parity check matrixes. Herein, the eight parity check matrixes are discriminated from each other by the $k_B$ values, wherein the eight $k_B$ values include 8, 9, 10, 11, 12, 13, 14, and 15. Further, the lifting element L is determined by Equation (7) below.

$$l = \log_2 \quad (7)$$
$$L = \left\lceil \log_2 \frac{k}{15} \right\rceil$$

Further, the $k_B$ value is determined to be one value from among 8, 9, 10, 11, 12, 13, 14, and 15 by using Equation (2). Based on the determined $k_B$ value, a parity check matrix to be used for generation of an (n, k) codeword vector is selected.

Third, the case when p is 9 is discussed.

Since p is 9, which implies that the encoder uses a total of nine parity check matrixes, the encoder may select a parity check matrix to be used for generation of an (n, k) codeword vector from the nine parity check matrixes. Herein, the nine parity check matrixes are discriminated from each other by the $k_B$ values, wherein the nine $k_B$ values include 9, 10, 11, 12, 13, 14, 15, 16, and 17. Further, the lifting element L is determined by Equation (8) below.

$$l = \log_2 \qquad (8)$$
$$L = \left\lceil \log_2 \frac{k}{17} \right\rceil$$

Further, the $k_B$ value is determined to be one value from among 9, 10, 11, 12, 13, 14, 15, 16, and 17 by using Equation (2). Based on the determined $k_B$ value, a parity check matrix to be used for generation of an (n, k) codeword vector is selected.

Fourth, the case when p is ten (10) is discussed.

Since p is ten (10), which implies that the encoder uses a total of ten parity check matrixes, the encoder may select a parity check matrix to be used for generation of an (n, k) codeword vector from the ten parity check matrixes. Herein, the ten parity check matrixes are discriminated from each other by the $k_B$ values, wherein the ten $k_B$ values include 10, 11, 12, 13, 14, 15, 16, 17, 18, and 19. Further, the lifting element L is determined by Equation (9) below.

$$l = \log_2 \qquad (9)$$
$$L = \left\lceil \log_2 \frac{k}{19} \right\rceil$$

Further, the $k_B$ value is determined to be one value from among 10, 11, 12, 13, 14, 15, 16, 17, 18 and 19 by using Equation (2). Based on the determined $k_B$ value, a parity check matrix to be used for generation of an (n, k) codeword vector is selected.

Fifth, the case when p is eleven (11) is discussed.

Since p is eleven (11), which implies that the encoder uses a total of eleven parity check matrixes, the encoder may select a parity check matrix to be used for generation of an (n, k) codeword vector from the eleven parity check matrixes. Herein, the eleven parity check matrixes are discriminated from each other by the $k_B$ values, wherein the eleven $k_B$ values include 11, 12, 13, 14, 15, 16, 17, 18, 19, 20, and 21. Further, the lifting element L is determined by Equation (10) below.

$$l = \log_2 \qquad (10)$$
$$L = \left\lceil \log_2 \frac{k}{21} \right\rceil$$

Further, the $k_B$ value is determined to be one value from among 11, 12, 13, 14, 15, 16, 17, 18, 19, 20, and 21 by using Equation (2). Based on the determined $k_B$ value, a parity check matrix to be used for generation of an (n, k) codeword vector is selected.

Sixth, the case when p is twelve (12) is discussed.

Since p is twelve (12), which implies that the encoder uses a total of twelve parity check matrixes, the encoder may select a parity check matrix to be used for generation of an (n, k) codeword vector from the twelve parity check matrixes. Herein, the twelve parity check matrixes are discriminated from each other by the $k_B$ values, wherein the twelve $k_B$ values include 12, 13, 14, 15, 16, 17, 18, 19, 20, 21, 22 and 23. Further, the lifting element L is determined by Equation (11) below.

$$l = \log_2 \qquad (11)$$
$$L = \left\lceil \log_2 \frac{k}{23} \right\rceil$$

Further, the $k_B$ value is determined to be one value from among 12, 13, 14, 15, 16, 17, 18, 19, 20, 21, 22, and 23 by using Equation (2). Based on the determined $k_B$ value, a parity check matrix to be used for generation of an (n, k) codeword vector is selected.

Next, a structure of a signal reception apparatus of a communication system using an HARQ scheme according to an exemplary embodiment of the present invention will be described with reference to FIG. 5.

Figure 5:
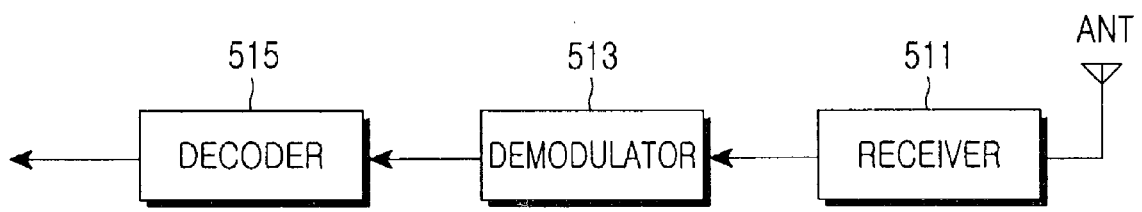
FIG. 5 is a block diagram illustrating a structure of a signal reception apparatus of a communication system using an HARQ scheme according to an exemplary embodiment of the present invention.

FIG. 5 is a block diagram illustrating a structure of a signal reception apparatus of a communication system using an HARQ scheme according to an exemplary embodiment of the present invention.

Referring to FIG. 5, the signal reception apparatus includes a receiver 511, a demodulator 513, and a decoder 515. First, a signal transmitted by a signal transmission apparatus is received through an antenna of the signal reception apparatus. Then, the signal received through the antenna is delivered to the receiver 511. Upon receiving the signal, the receiver processes the signal, and then outputs a reception vector generated from the received signal to the demodulator 513. Then, the demodulator 513 demodulates the reception vector according to a demodulation scheme corresponding to the modulation scheme applied by a modulator (e.g. the modulator 313) of the signal transmission apparatus, and outputs the demodulated vector to the decoder 515. The decoder 515 receives the demodulated vector from the demodulator 513, decodes the demodulated vector according to a decoding scheme corresponding to the encoding scheme employed by an encoder (e.g. the encoder 311) of the signal transmission apparatus, and outputs a restored information vector generated by the decoding. As used herein, the parity check matrix used by the decoder 515 is substantially equal to the parity check matrix used by the encoder 311. Also, it is assumed that either the signal transmission apparatus may separately provide the information on the parity check matrix used by the encoder 311 to the signal reception apparatus or the information on the parity check matrix determined through the process as described above with reference to FIG. 4 may be known in advance between the signal transmission apparatus and the signal reception apparatus.

Exemplary embodiments of the present invention enable encoding and decoding of LDPC codes, which can support various coding rates. Therefore, the exemplary embodiments of the present invention enable signal transmission/reception using various coding rates while using LDPC codes in a communication system using an HARQ scheme.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method of transmitting a signal by a signal transmission apparatus in a communication system using a Hybrid Automatic Repeat reQuest (HARQ) scheme, the method comprising:
generating a codeword vector by encoding an information vector by using a first parity check matrix of Low Density Parity Check (LDPC) codes;
generating a transmission vector by processing the codeword vector; and
transmitting the transmission vector, wherein, when the first parity check matrix comprises a plurality of square matrix columns, each square matrix has a size of L×L, the first parity check matrix is one of p parity check matrixes stored in the signal transmission apparatus, the p parity check matrixes support different numbers of information vector square matrix columns, and each of the numbers of information vector square matrix columns indicates the number of square matrix columns corresponding to the information vector from among the plurality of square matrix columns, and wherein, the first parity check matrix is a parity check matrix supporting the number of information vector square matrix columns determined by using the length of the information vector and the value L from the p parity check matrixes, and the value L is determined by using p and the length of the information vector.

2. The method of claim 1, wherein, when the HARQ scheme is an Incremental Redundancy (IR) scheme and the transmission vector is an initially transmitted transmission vector, the length of the transmission vector is determined by at least one of the length of the codeword vector, the length of the information vector, and the number of the information vector square matrix columns.

3. The method of claim 1, wherein p comprises a value determined in consideration of the length of a padding vector and a storage capacity for storing the p parity check matrixes, and wherein when the length of the information vector is smaller than a product obtained by multiplying the value L by the number of information vector square matrix columns, the padding vector comprises a length obtained by subtracting the length of the information vector from the product.

4. The method of claim 1, further comprising determining the value L by $$l = \log_2$$
$$L = \left\lceil \log_2 \frac{k}{2p-1} \right\rceil,$$

wherein ⌈x⌉ refers to a minimum integer larger than or equal to x, and k denotes the length of the information vector.

5. The method of claim 4, further comprising determining the number of the information vector square matrix columns by $$k_B = \lceil 2^{-l} k \rceil = \left\lceil \frac{k}{L} \right\rceil,$$

wherein $k_B$ denotes the number of the information vector square matrix columns.

6. The method of claim 4, wherein p comprises a value corresponding to one of 7, 8, 9, 10, 11, and 12.

7. An apparatus for transmitting a signal in a communication system using a Hybrid Automatic Repeat reQuest (HARQ) scheme, the apparatus comprising:

an encoder for generating a codeword vector by encoding an information vector by using a first parity check matrix of Low Density Parity Check (LDPC) codes; and a transmitter for generating a transmission vector by processing the codeword vector, and for transmitting the transmission vector, wherein, when the first parity check matrix comprises a plurality of square matrix columns, each square matrix has a size of L×L, the first parity check matrix is one of p parity check matrixes stored in the signal transmission apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

8. The apparatus of claim 7, wherein, when the HARQ scheme is an Incremental Redundancy (IR) scheme and the transmission vector is an initially transmitted transmission vector, the length of the transmission vector is determined by at least one of the length of the codeword vector, the length of the information vector, and the number of the information vector square matrix columns.

9. The apparatus of claim 7, wherein p comprises a value determined in consideration of the length of a padding vector and a storage capacity for storing the p parity check matrixes, and wherein, when the length of the information vector is smaller than a product obtained by multiplying the value L by the number of information vector square matrix columns, the padding vector comprises a length obtained by subtracting the length of the information vector from the product.

10. The apparatus of claim 7, wherein the value L is determined by $$l = \log_2$$
$$L = \left\lceil \log_2 \frac{k}{2p-1} \right\rceil,$$

wherein ⌈x⌉ refers to a minimum integer larger than or equal to x, and k denotes the length of the information vector.

11. The apparatus of claim 10, wherein the number of the information vector square matrix columns is determined by $$k_B = \lceil 2^{-l} k \rceil = \left\lceil \frac{k}{L} \right\rceil,$$

wherein $k_B$ denotes the number of the information vector square matrix columns.

12. The apparatus of claim 10, wherein p comprises a value corresponding to one of 7, 8, 9, 10, 11, and 12.

13. A method of receiving a signal in a communication system using a Hybrid Automatic Repeat reQuest (HARQ) scheme, the method comprising:

generating a reception vector by processing a received signal; and restoring an information vector by decoding the reception vector by using a first parity check matrix of Low Density Parity Check (LDPC) codes, wherein, when the first parity check matrix comprises a plurality of square matrix columns, each square matrix has a size of L×L, the first parity check matrix is one of p parity check matrixes stored in a signal transmission apparatus corresponding to the signal reception apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

14. The method of claim 13, wherein, when the HARQ scheme is an Incremental Redundancy (IR) scheme and the reception vector is a transmission vector initially transmitted by the signal transmission apparatus, the length of the transmission vector is determined by at least one of the determined value L, the length of the codeword vector, the length of the information vector, and the number of the information vector square matrix columns, and the length of the codeword vector indicates a length of a codeword vector generated from the information vector by using the first parity check matrix by the signal transmission apparatus.

15. The method of claim 13, wherein p comprises a value determined in consideration of the length of a padding vector and a storage capacity for storing the p parity check matrixes, and wherein, when the length of the information vector is smaller than a product obtained by multiplying the value L by the number of information vector square matrix columns, the padding vector comprises a length obtained by subtracting the length of the information vector from the product.

16. The method of claim 13, further comprising determining the value L by $$l = \log_2$$
$$L = \left\lceil \log_2 \frac{k}{2p-1} \right\rceil,$$

wherein, $\lceil x \rceil$ refers to a minimum integer larger than or equal to x, and k denotes the length of the information vector.

17. The method of claim 16, further comprising determining the number of the information vector square matrix columns by $$k_B = \lceil 2^{-l}k \rceil = \left\lceil \frac{k}{L} \right\rceil,$$

wherein $k_B$ denotes the number of the information vector square matrix columns.

18. The method of claim 16, wherein p comprises a value corresponding to one of 7, 8, 9, 10, 11, and 12.

19. An apparatus for receiving a signal in a communication system using a Hybrid Automatic Repeat reQuest (HARQ) scheme, the apparatus comprising:

a receiver for generating a reception vector by processing a received signal; and a decoder for restoring an information vector by decoding the reception vector by using a first parity check matrix of Low Density Parity Check (LDPC) codes, wherein, when the first parity check matrix comprises a plurality of square matrix columns, each square matrix has a size of L×L, the first parity check matrix is one of p parity check matrixes stored in a signal transmission apparatus corresponding to the signal reception apparatus, the p parity check matrixes support different numbers of information vector square matrix columns, and each of the numbers of information vector square matrix columns indicates the number of square matrix columns corresponding to the information vector from among the plurality of square matrix columns, and wherein the first parity check matrix is a parity check matrix supporting the number of information vector square matrix columns determined by using the length of the information vector and the value L from the p parity check matrixes, and the value L is determined by using p and the length of the information vector.

20. The apparatus of claim 19, wherein, when the HARQ scheme is an Incremental Redundancy (IR) scheme and the reception vector is a transmission vector initially transmitted by the signal transmission apparatus, the length of the transmission vector is determined by at least one of the determined value L, the length of the codeword vector, the length of the information vector, and the number of the information vector square matrix columns, and the length of the codeword vector indicates a length of a codeword vector generated from the information vector by using the first parity check matrix by the signal transmission apparatus.

21. The apparatus of claim 19, wherein p comprises a value determined in consideration of the length of a padding vector and a storage capacity for storing the p parity check matrixes, and wherein, when the length of the information vector is smaller than a product obtained by multiplying the value L by the number of information vector square matrix columns, the padding vector comprises a length obtained by subtracting the length of the information vector from the product.

22. The apparatus of claim 19, wherein the value L is determined by $$l = \log_2$$
$$L = \left\lceil \log_2 \frac{k}{2p-1} \right\rceil,$$

wherein, $\lceil x \rceil$ refers to a minimum integer larger than or equal to x, and k denotes the length of the information vector.

23. The apparatus of claim 22, wherein the number of the information vector square matrix columns is determined by $$k_B = \lceil 2^{-l}k \rceil = \left\lceil \frac{k}{L} \right\rceil,$$

wherein $k_B$ denotes the number of the information vector square matrix columns.

24. The apparatus of claim 22, wherein p comprises a value corresponding to one of 7, 8, 9, 10, 11, and 12.

* * * * *